(12) United States Patent
Yang

(10) Patent No.: US 10,468,445 B2
(45) Date of Patent: Nov. 5, 2019

(54) IMAGE SENSOR AND METHOD FOR FABRICATING THE SAME

(71) Applicant: SK hynix Inc., Gyeonggi-do (KR)

(72) Inventor: Yun-Hui Yang, Chungcheongbuk-do (KR)

(73) Assignee: SK hynix Inc., Gyeonggi-do (KR)

(*) Notice: Subject to any disclaimer, the term of this patent is extended or adjusted under 35 U.S.C. 154(b) by 0 days.

(21) Appl. No.: 15/972,703

(22) Filed: May 7, 2018

(65) Prior Publication Data
US 2019/0088700 A1 Mar. 21, 2019

(30) Foreign Application Priority Data

Sep. 15, 2017 (KR) .................. 10-2017-0118651

(51) Int. Cl.
*H01L 27/146* (2006.01)
(52) U.S. Cl.
CPC .. *H01L 27/14623* (2013.01); *H01L 27/14612* (2013.01); *H01L 27/14621* (2013.01); *H01L 27/14627* (2013.01); *H01L 27/14685* (2013.01); *H01L 27/14689* (2013.01)

(58) Field of Classification Search
CPC ......... H01L 27/14623; H01L 27/14621; H01L 27/14685; H01L 27/14627
See application file for complete search history.

(56) References Cited

U.S. PATENT DOCUMENTS

| 8,614,494 B2 | 12/2013 | Kurogi |
| 2012/0241895 A1* | 9/2012 | Kurogi .............. H01L 27/14603 257/437 |
| 2014/0159184 A1 | 6/2014 | Lim |
| 2015/0155327 A1 | 6/2015 | Kuboi |

* cited by examiner

*Primary Examiner* — Kyoung Lee
(74) *Attorney, Agent, or Firm* — IP & T Group LLP

(57) ABSTRACT

This technology relates to an image sensor. The image sensor includes a substrate including a photoelectric transformation element, the substrate includes a first surface and a second surface faced to the first surface; first and second shielding layers overlapped to photoelectric transformation element and formed over the first and second surfaces, respectively; and a third shielding layer surrounding the photoelectric transformation element and contacted to the first and second shielding layers by penetrating the substrate.

20 Claims, 10 Drawing Sheets

IMAGE SENSOR AND METHOD FOR FABRICATING THE SAME

CROSS-REFERENCE TO RELATED APPLICATIONS

The present application claims priority to Korean Patent Application No. 10-2017-0118651, filed on Sep. 15, 2017, which is incorporated herein by reference in its entirety.

BACKGROUND

1. Field

Exemplary embodiments relate to a semiconductor device and, more particularly, to an optical black pixel array of an image sensor and fabricating method thereof.

2. Description of the Related Art

An image sensor senses external images as light, converts the sensed light into electric signals and transmits the electric signals to devices that process digital signals. The image sensor includes an active pixel array which receives the light, logic circuits which include peripheral circuits, and optical black pixel arrays, which shield the light.

The active pixel array includes pixels that generate photo charges by absorbing the incident light from the outside and accumulate the photo charges. The optical black pixel array is configured to shield the incident light to use an output signal from the pixel as an offset value in a dark state.

Also, the optical black pixel array shields the introduction of unwanted light to minimize interference. As the active pixel array and the optical black pixel array have different functions, they also have different structures.

SUMMARY

Various embodiments are directed to an optical black pixel array and a method of fabricating the same that improve the light shielding property and the electrical insulating property of an optical black pixel array.

In an embodiment, an optical black pixel array of an image sensor may comprise: a substrate including a photoelectric transformation element, the substrate includes a first surface and a second surface faced to the first surface; first and second shielding layers overlapped to photoelectric transformation element and formed over the first and second surfaces, respectively; and a third shielding layer surrounding the photoelectric transformation element and contacted to the first and second shielding layers by penetrating the substrate.

The first and second shielding layers may be of a planar shape. The third shielding layer may be of a ring shape. Each of the first to second shielding layers may be formed of an insulation material including a light shielding property. The photoelectric transformation element may include a plurality of photoelectric transformation regions.

In an embodiment, an optical black pixel array of an image sensor may comprise: a substrate including a photoelectric transformation element, the substrate includes a first surface and a second surface faced to the first surface; first and second shielding layers overlapped to the photoelectric transformation element and formed over the first and second surfaces of the substrate, respectively; a third shielding layer surrounding the photoelectric transformation element and contacted to the a first and second shielding layers by penetrating the substrate; signal transmission unit including a multi-layered metal wires formed over the second shielding layer; and supporting unit electrically connecting the photoelectric transformation element and the signal transmission unit and interposed therebetween.

The optical black pixel array of may further comprise: a first insulation layer formed between the lowermost metal wire among the multi-layered metal wires and the second shielding layer; and a second insulation layer formed between the first shielding layer and the second shielding layer. The second insulation layer is formed to surround an outer wall of the second shielding layer. The supporting unit is formed to penetrate the second shielding layer. The supporting unit includes: a transistor electrically connected to the photoelectric transformation element; and a plug electrically connected to the transistor and the lowermost metal wire among the multi-layered metal wires.

The first and second shielding layers include a planar shape and the third shielding layer include a ring shape. Each of the first to second shielding layers is formed of an insulation material including a light shielding property. The photoelectric transformation element includes a plurality of photoelectric transformation regions. The image sensor of may further comprise: a color filter layer formed over the first shielding layer; and a micro-lens formed over the color filter.

In an embodiment, a fabricating method of an optical black pixel array of an image sensor, may comprise: forming a photoelectric transformation element in a substrate including a first surface and a second surface faced to the first surface; and forming a shielding layer surrounding and overlapping the photoelectric transformation element, the shielding layer includes first and second shielding layers formed over the first and second surfaces, respectively; and a third shielding layer surrounding the photoelectric transformation element and contacting to the first and second shielding layers by penetrating the substrate.

Before the forming of the shielding layer, the method may further comprise: forming a supporting unit over the second surface of the substrate; and forming a signal transmission unit including a multi-layered metal wires.

The supporting unit may include a transistor electrically connected to the photoelectric transformation element; and a plug electrically connected to the transistor and the lowermost metal wire among the multi-layered metal wires.

The forming of the supporting unit, may include forming the supporting unit over the second surface of the substrate; forming a transistor electrically connected to the photoelectric transformation element over the second surface of the substrate; forming a first insulation layer over the second surface of the substrate to cover a gate of the transistor; forming a first insulation pattern overlapping the photoelectric transformation element and including a first opening formed by etching the first insulation layer; forming a sacrificial layer in the first opening; forming a second insulation layer over the first insulation pattern including the sacrificial layer; and forming a plug electrically connected to the transistor by penetrating the second insulation layer and the sacrificial layer.

The forming of the shielding layer surrounding the photoelectric transformation element, may include forming a trench by etching the substrate starting from the first surface of the substrate to expose the sacrificial layer; forming a second opening by removing the sacrificial layer; and depositing a shielding material to the second opening until the shielding material covers the first surface of the substrate.

The method may further comprise: forming a passivation layer between the second insulation layer and the sacrificial layer.

These and other features and advantages of the present invention will become apparent to those with ordinary skill in the art to which the present invention belongs from the following description in conjunction with the accompanying drawings.

DETAILED DESCRIPTION

Figure 1:
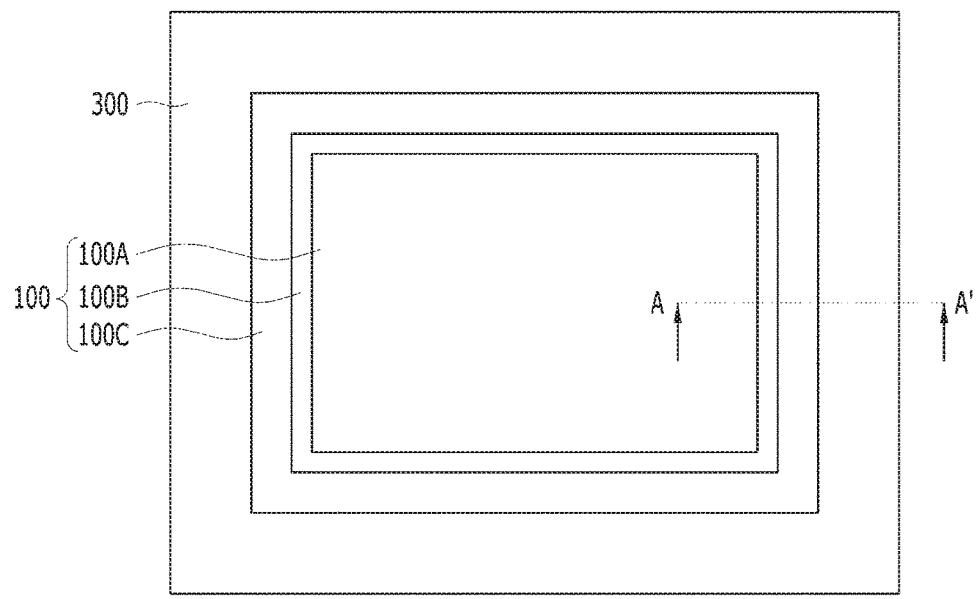
FIG. 1 is a plan view illustrating an image sensor in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated to clearly illustrate features of the embodiments. When a first layer is referred to as being "on" a second layer or "on" a substrate, it not only refers to a case in which the first layer is formed directly on the second layer or the substrate but also a case in which a third layer exists between the first layer and the second layer or the substrate.

Although the terms such as first and second may be used to describe various components, the components are not limited by the terms, and the terms are used only to distinguish components from other components.

The terminology used herein is for the purpose of describing particular embodiments only and is not intended to be limiting of the present invention. As used herein, singular forms are intended to include the plural forms as well, unless the context clearly indicates otherwise.

It will be further understood that the terms "comprises", "comprising", "includes", and "including" when used in this specification, specify the presence of the stated elements and do not preclude the presence or addition of one or more other elements. As used herein, the term "and/or" includes any and all combinations of one or more of the associated listed items.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Various embodiments to be described herein provide an optical black pixel array of an image sensor. In particular, the embodiments provide a method of improving the light shielding properties and the electrical isolation properties for optical black pixel arrays. The image sensor according to an embodiment may include a shielding layer completely surrounding a photoelectric transformation element of the optical black pixel array.

FIG. 1 is a plan view illustrating an image sensor in accordance with an embodiment of the present invention.

As shown in FIG. 1, the image sensor according to the embodiment may include a pixel array region 100 and a logic region 300. The pixel array region 100 may include an active pixel array region 100A, a dummy pixel array region 100B, and an optical black pixel array region 100C. The active pixel array region 100A and the optical black pixel array region 100C may be adjacent to each other with the dummy pixel array region 100B therebetween.

The active pixel array region 100A may receive an incident light originating from an object to generate photo charges. Although not shown in the drawing, the active pixel array region 100A is electrically connected to a plurality of row lines and a plurality of column lines for receiving the incident light from the object to generate the photo charges, and includes a plurality of pixels arranged in a matrix form. Each of the plurality of pixels may include a red pixel that generates photo-charges corresponding to an incident light from a red spectral region, a green pixel that generates photo-charges corresponding to an incident light from a green spectral region, and a blue pixel that generates photo-charges corresponding to an incident light from a green spectral region. Here, the plurality of pixels may include color filters to transmit the incident light of the specific spectral regions. In addition, each of the pixels may include a photoelectric transformation element, a transfer transistor, a selection transistor, a reset transistor, and an access transistor.

The optical black pixel array disposed in the optical black pixel array region 100C shields the incident light from the outside and is used to inspect and evaluate electrical characteristics (for example, dark noise characteristics caused by a dark current) of the active pixel array. In other words, the optical black pixel array inspects and evaluates the dark noise characteristic by the dark current, and compensates a current value corresponding to the dark current of the active pixel array, thereby offsetting the dark current. Thus, the dark noise may be removed from the image sensor.

Figure 2:
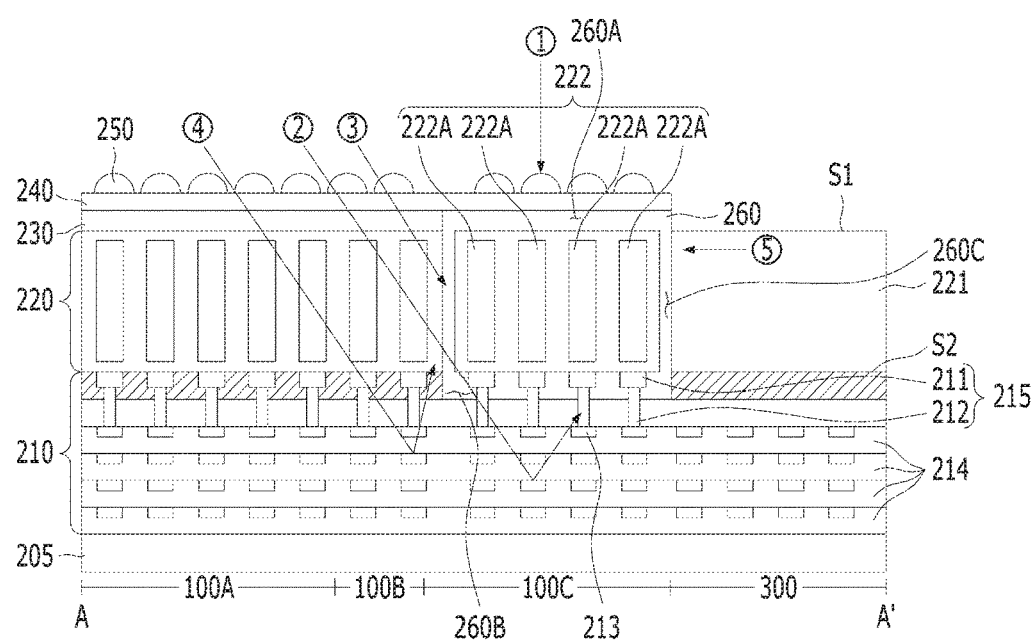
FIG. 2 is a cross-sectional view taken along the line A-A' in the image sensor shown in FIG. 1 in accordance with an embodiment of the present invention.

FIG. 2 is a cross-sectional view taken along the line A-A' in the image sensor shown in FIG. 1.

As shown in FIG. 2, the image sensor according to the embodiment includes a stacked structure which includes a plurality of micro-lenses 250, a color filter layer 240, a planarization layer 230, a shielding layer 260, a substrate structure 220, a signal transmission unit 210 and a wafer 205 sequentially stacked from top to bottom. The stacked structure may be identically applied to the active pixel array region 100A, the dummy pixel array region 100B and the optical black pixel array region 100C.

The plurality of micro-lenses 250 condense an incident light from an outside. Each of the micro-lenses 250 may include a hemispherical lens, a convex shaped lens or concave shaped lens.

The color filter layer 240 allows only a visible light to pass through among the incident light from the micro-lenses 250. A plurality of color filters are included in the color filter layer 240. The plurality of color filters may include a plurality of red filters R for passing only a red light among the visible light, a plurality of green filters G for passing only a green light among the visible light and a plurality of blue filters B for passing only a blue light among the visible light. If necessary, the color filters 140 may further include a plurality of cyan filters, a plurality of yellow filters, and a plurality of magenta filters.

The substrate structure 220 may include a substrate 221 including a first surface S1 and a second surface S2 facing to the first surface S1, and a photoelectric transformation element 222 including a plurality of photoelectric transformation regions 222A.

The substrate 221 may be divided into the active pixel array region 100A, the dummy pixel array region 100B, the optical black pixel array region 100C, and the logic region 300.

In the active pixel array region 100A, the planarization layer 230 may be positioned between the color filter layer 240 and the substrate structure 220. The planarization layer 230 allows all of the incident light through the color filter layer 240 to be transferred to the photoelectric transformation element 222 of the active pixel array region 100A at a predetermined angle. For example, the planarization layer 230 may have a flat surface. The planarization layer 230 may comprise an insulation material. For example, the planarization layer 230 may include a hafnium oxide $HfO_2$ layer. Since a hafnium oxide $HfO_2$ layer has a high transmittance, most of the incident light from the outside may pass through the planarization layer 230 and transfer to the substrate structure 220.

The signal transmission unit 210 may include a layer 214 formed between a multi-layered metal wires 213. The insulation layer 214 may be a single layer or a multilayered layer. The insulation layer 214 may be a single layer of one selected from a group including an oxide layer, a nitride layer, and a oxynitride layer, or a stacked layer in which two or more of them are stacked. Although not shown in the drawing, the signal transmission unit 210 may further include a plurality of plugs and a plurality of transistors for electrically connecting the multi-layer metal wires. The plurality of transistors may include transfer transistors, reset transistors, source follower transistors, selection transistors, and bias transistors. The plurality of transistors may be electrically connected by the multi-layered metal wires 213.

The signal transmission unit 210 may include a supporting unit 215 including a gate 211 of the transfer transistor and a plug 212. The plug 212 electrically connects the gate 211 and the lowermost metal wire of the multi-layered metal wires 213.

The supporting unit 215 is formed between the shielding layer 260 and the multi-layered metal wires 213. The supporting unit 215 may prevent the substrate structure 220 of the optical black pixel array region 100C from collapsing during the formation of the shielding layer 260. A supporting unit 215 may be formed by penetrating the second shielding layer 260B.

The wafer 205 is formed below the signal transmission unit 210 and may support and protect the signal transmission unit 210. That is, the wafer 205 prevents the metal wires 213 formed in the signal transmission unit 210 from being influenced by an external environment. The wafer 205 may include a silicon oxide layer, a silicon nitride layer, or a composite layer composed of a combination thereof, or may be formed of a single crystal silicon.

The shielding layer 260 is formed in the optical black pixel array region 100C. The shielding layer 260 shields the incident light from the outside, and prevents it from being transmitted to the photoelectric transformation element 222 in the substrate structure 220. The shielding layer 260 may be formed of a material having excellent gap-fill characteristics and shielding an electrical signal by reflecting or absorbing light. Also, the shielding layer 260 is formed to surround an outer surface of the substrate structure 220, the signal transmission unit 210 and the color filter layer 240 of the optical black pixel array region 100C and to contact the substrate 221 of the logic region 300 and the substrate structure 220 of the active pixel region 100A.

The shielding layer 260 overlaps the photoelectric transformation element 222 and includes a first shielding layer 260A and a second shielding layer 260B formed over the first surface S1 and the second surface S2 of the substrate 221. The shielding layer 260 may further include a third shielding layer 260C which penetrates the substrate 221 to contact the first shielding layer 260A and the second shielding layer 260B and surrounds the photoelectric transformation element 222.

The first shielding layer 260A and the second shielding layer 260B may be of a planar shape, i.e., may be extending in a plane parallel to the wafer 205. The third shielding layer 260C may be of a ring shape, i.e. may have a ring shape extending vertically to the plane of the wafer 205, and surrounding the photoelectric transformation element 222. The third shielding layer 260C may shield the incident light and electrical signals transferred from the active pixel array region 100A and the logic region 100C. In particular, the first shielding layer 260A may be a planar shape that is in contact with the color filter layer 240 of the optical black pixel array region 100C. Thus, the incident light to be transferred to the substrate structure 220 through the micro-lenses 250 of the optical black pixel array region 100C is shielded by the first shielding layer 260A (see reference numeral '①' of FIG. 2).

In the description, the micro-lenses 250 and the color filter layer 240 are formed over the optical black pixel array region 100C. However, the embodiment is not limited thereto. As an alternative, the micro-lenses 250 and the color filter layer 240 may not be formed in the optical black pixel array region 100C. In this case, the incident light directly to be transferred to the substrate structure 220 is shielded by the first shielding layer 260A (refer to reference numeral '①' in FIG. 2).

The second shielding layer 260B may be a planar shape contacted with the signal transmission unit 210 of the optical black pixel array region 100C. The second shielding layer 260B shields the incident light that is scattered by the metal wire 213 of the optical black pixel array region 100C and prevents it from being transferred to the substrate structure 220 of the optical black pixel array region 100C (Refer to reference numeral '②' in FIG. 2).

Since the third shielding layer 260C is a ring shape surrounding the photoelectric transformation element 222, the third shielding layer 260C can shield the incident light (Refer to reference numeral '③' in FIG. 2) from being transferred to the substrate structure 220 of the optical pixel array region 100C from the active pixel array region 100A and the incident light (Refer to reference numeral '④' in FIG. 2) that is scattered by the metal wire 213 of the active pixel region 100A from being transferred to the substrate structure 220 of the optical black pixel array region 100C. In addition, the third shielding layer 260C can completely shield electrical crosstalk from the substrate of the logic region 300 from being transferred to the substrate structure 220 of the optical black pixel array region 100C (Refer to reference numeral '⑤' in FIG. 2).

As described above, the image sensor according to the embodiment shields the incident light and the electric crosstalk from the outside of the optical black pixel array 100C, thereby generating an optical black signal having a dark level without a noise.

Figure 3:
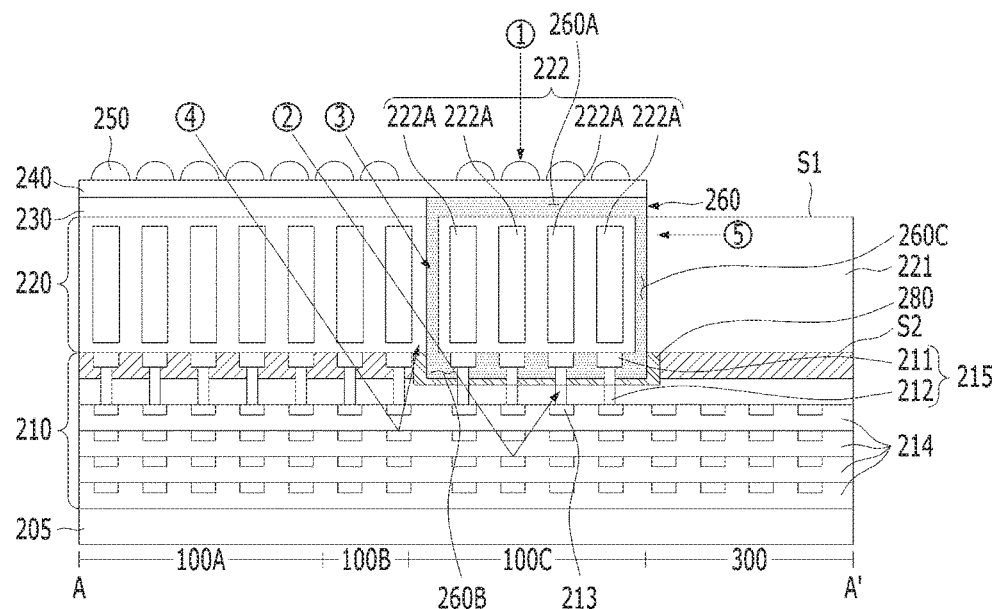
FIG. 3 is a cross-sectional view taken along the line A-A' in the image sensor shown in FIG. 1 in accordance with an embodiment of the present invention.

FIG. 3 is a cross-sectional view taken along the line A-A' in the image sensor shown in FIG. 1 in accordance with an embodiment of the present invention. For convenience of description, the same reference numerals are used for the same elements as those of the embodiment in FIG. 2, and a detailed description thereof will be omitted.

As shown in FIG. 3, the optical black pixel array region 100C includes a photoelectric transformation element 222, a substrate 221 including a first surface S1 and a second surface S2 facing to the first surface S1, a shielding layer 260 which overlaps the photoelectric transformation element 222 and includes a first shielding layer 260A and a second shielding layer 260B formed over the first surface S1 and the second surface S2 of the substrate 221. The shielding layer 260 may further include a third shielding layer 260C that contacts to the first shielding layer 260A and the second shielding layer 260B by penetrating the substrate 221 and surrounds the photoelectric transformation element 222.

In addition, the optical black pixel array region 100C of the image sensor may include a first insulation layer that is formed between the lowermost metal wire 213 among the multi-layered metal wires 213 and a second insulation layer that is formed between the second shielding layer 260B and the first insulation layer.

Here, the first insulation layer may be an insulation layer 214, and the second insulation layer may be a passivation layer 280. The passivation layer 280 may prevent damage to the metal wire 213 during the formation of the shielding layer 260. Thus, the passivation layer 280 may have a shape that surrounds an outer wall of the second shielding layer 260B. The passivation layer 280 may surround the lower part of the third shielding layer 260C which extends into the second surface S2. The passivation layer 280 will be described in more detail with reference to the fabricating method described later.

Figure 4:
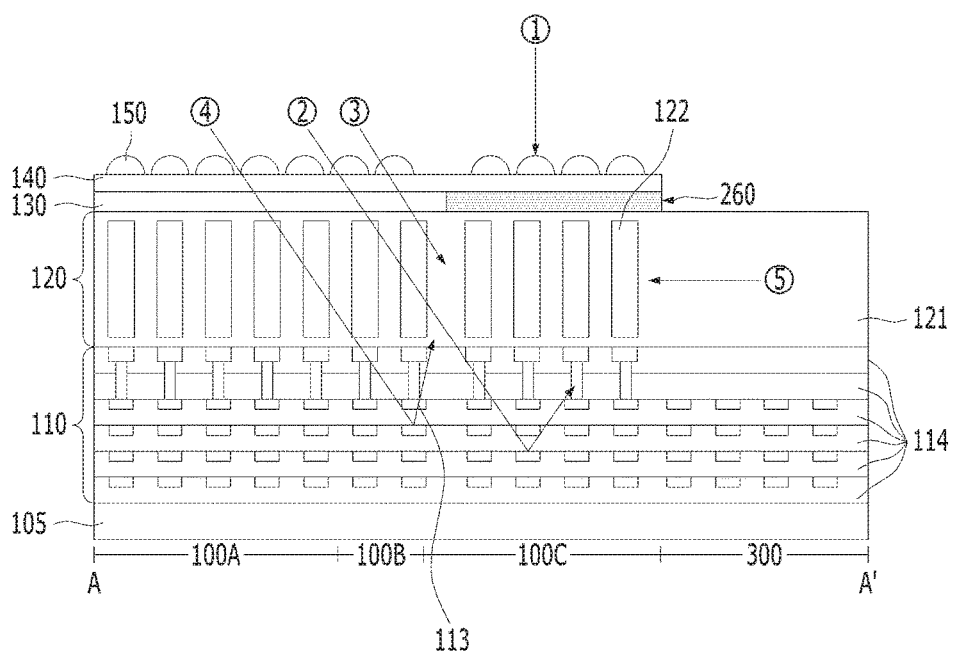
FIG. 4 is a cross-sectional view taken along the line A-A' in the pixel array region shown in FIG. I. in accordance with a comparative example of the image sensor shown in the FIG. 2 and FIG. 3.

FIG. 4 is a cross-sectional view taken along the line A-A' in the pixel array region shown in FIG. 1 in accordance with a comparative example of the image sensor shown in the FIG. 2 and FIG. 3

As shown in FIG. 4, a conventional image sensor may include a stacked structure which includes a plurality of micro-lenses 150, a color filter layer 140, a planarization layer 130, a shielding layer 160, a substrate structure 120, a signal transmission unit 110 and a wafer 105 sequentially stacked to bottom. The stacked structure may typically be identically applied to the active pixel array region 100A, the dummy pixel array region 100B and the optical black pixel array region 100C.

In the optical black pixel array region 100C of the comparative example of FIG. 4, the shielding layer 160 may be positioned between the color filter layer 140 and the substrate structure 120. The shielding layer 160 shields the incident light from the outside through the color filters 140 not to be transferred to the photoelectric transformation element 122 in the substrate structure 120. The shielding layer 160 according to the comparative example is formed only between the color filter layer 140 and the substrate structure 120 so that the incident light directly to be transferred to the substrate structure 220 is shielded by the shielding layer 160 (Refer to reference numeral '①' in FIG. 4).

Figure 7:
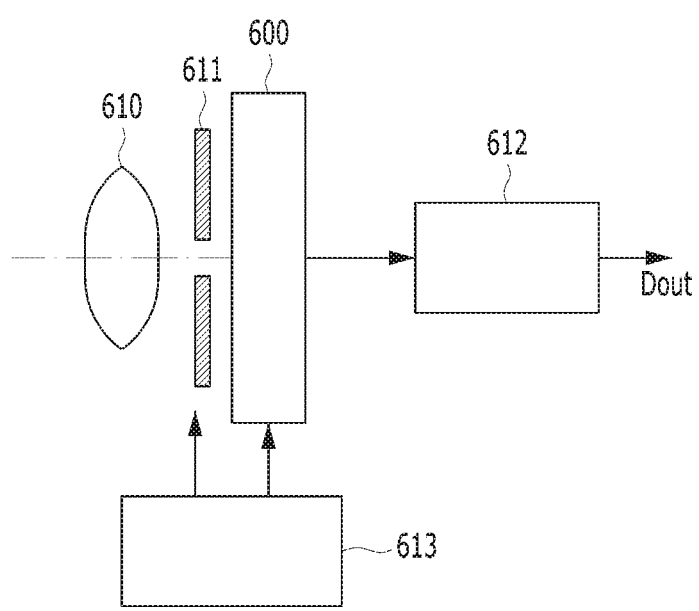
FIG. 7 is a diagram illustrating an electronic device including the image sensor in accordance with an embodiment of the present invention.

On the contrary, shielding layer 160 cannot shield the incident light that is scattered by the metal wire 113 of the optical black pixel array region 100C and to be transferred to the substrate structure 220 of the optical black pixel array region 100C (Refer to reference numeral '②' in FIG. 4), the third shielding layer 160C shield the incident light to be transferred to the substrate structure 120 of the optical pixel array region 100C from the active pixel array region 100A (Refer to reference numeral '③' in FIG. 4), the incident light that is scattered by the metal wire 113 of the active pixel region 100A and to be transferred to the substrate structure 220 of the optical black pixel array region 100C (Refer to reference numeral '④' in FIG. 7) and the electrical crosstalk from the substrate of the logic region 300 to be transferred to the substrate structure 120 of the optical black pixel array region 100C (Refer to reference numeral '⑤' in FIG. 7). Thus, an optical black pixel array cannot output pixel signals in a complete dark state.

On the other hand, since the image sensor according to the embodiments of the present invention includes the first shielding layer 260A to the third shielding layer 260C, the image sensor shields the incident light and the electric crosstalk from the outside of the optical black pixel array 100C, thereby generating an optical black signal having a dark level without a noise.

Hereinafter, an example of a method of fabricating an optical black pixel array region of an image sensor shown in FIG. 2 will be described in detail with reference to FIGS. 5A to 5L.

FIGS. 5A to 5L are cross-sectional views illustrating a method of fabricating an image sensor shown in FIG. 2. For reference, only the optical black pixel array region is shown in FIGS. 5A to 5L for convenience of explanation.

Figure 5A:
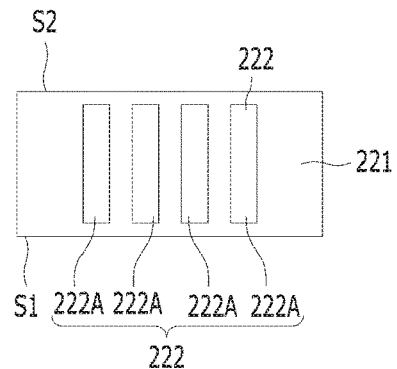
FIGS. 5A to 5L are cross-sectional views illustrating a method of fabricating an image sensor shown in the FIG. 2.

As shown in FIG. 5A, a photoelectric transformation element 222 is formed over a substrate 221. The photoelectric transformation element 222 may comprise a plurality of photoelectric transformation regions 222A. The substrate 221 on which the photoelectric transformation element 222 may correspond to the substrate structure 220 shown in FIG. The substrate 221 may have a first surface S1 and a second surface S2 facing the first surface S1. If the first surface S1 is a top surface, then the second surface S2 may be a bottom surface.

Figure 5B:
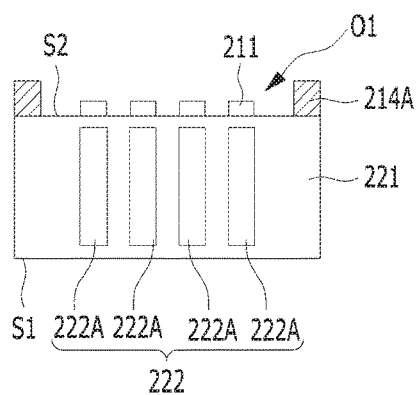

As shown in FIG. 5B, a plurality of gates 211 may be formed over the second surface S2 of the substrate 221. The gates 211 may be a gate of a transfer transistor TX, gates of other pixel transistors, such as selection transistors, reset transistors, and access transistors, and may also be formed while the gate of the transfer transistor TX is being formed.

Next, a first insulation layer pattern 214A is formed over the second surface S2 of the substrate 221. The first insulation layer pattern 214A may include a first opening O1 corresponding to a region in which a shielding layer 260 is to be formed. The first insulation layer pattern 214A may be thicker than the gate 211 so that a sacrificial layer 270 covers the gate 211 completely. The first insulation layer pattern includes an insulation layer including a first opening O1.

The first opening O1 is formed by etching the insulation layer until the substrate 221 overlapping the photoelectric transformation element 222 is exposed.

Figure 5C:
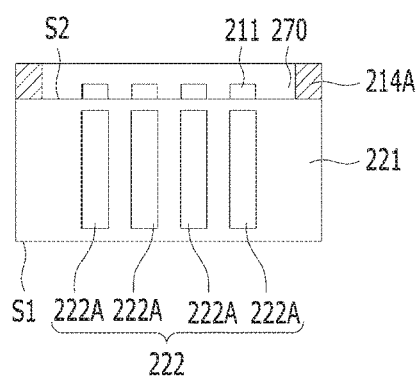

As shown in FIG. 5C, the sacrificial layer 270 is gap-filled to the first opening O1 so as to cover the gate 211 completely. The first insulation layer pattern 214A may be used as a mold layer or a guide pattern to form the sacrificial layer 270. The sacrificial layer 270 may have an etch selectivity to adjacent structures and may be formed of a material that is easily wet etched. The adjacent structure may include the substrate 221 and the first insulation layer pattern 214A.

Figure 5D:
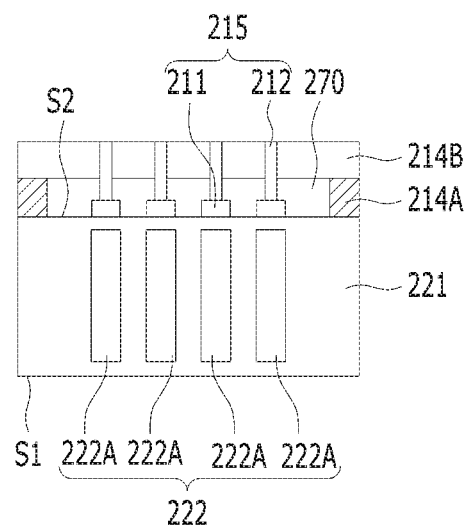

As shown in FIG. 5D, the second insulation layer 214B is formed over the sacrificial layer 270 and the first insulation layer pattern 214A. The second insulation layer 214B is used as an insulation layer for insulating a plurality of plugs 212 to be formed in a post process.

Subsequently, the sacrificial layer 270 and the second insulation layer 214B are etched until the gate 211 is exposed to form a contact hole (not shown). Then a metallic conductive material is buried in the contact hole, thereby forming the plug 212 electrically connected to the gate 21.

Figure 5E:
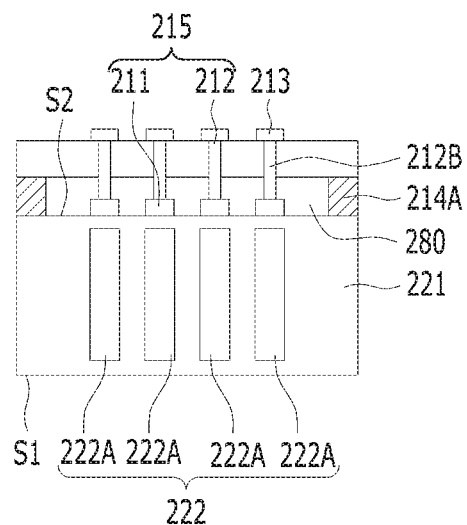

As shown in FIG. 5E, the metal wire 213 is formed over the second insulation layer 214B where the plug 212 is formed.

Figure 5F:
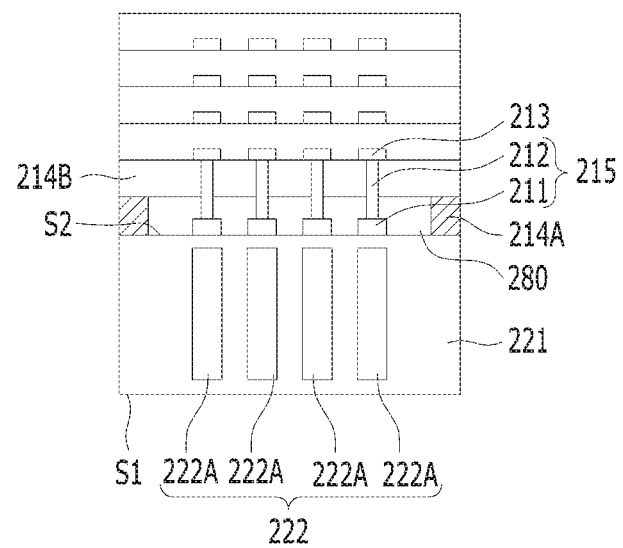

As shown in FIG. 5F, the signal transmission unit 210 is formed. The signal transmission unit 210 may include a multiple metal wires 213 and insulation layers 214 interposed therebetween.

Figure 5G:
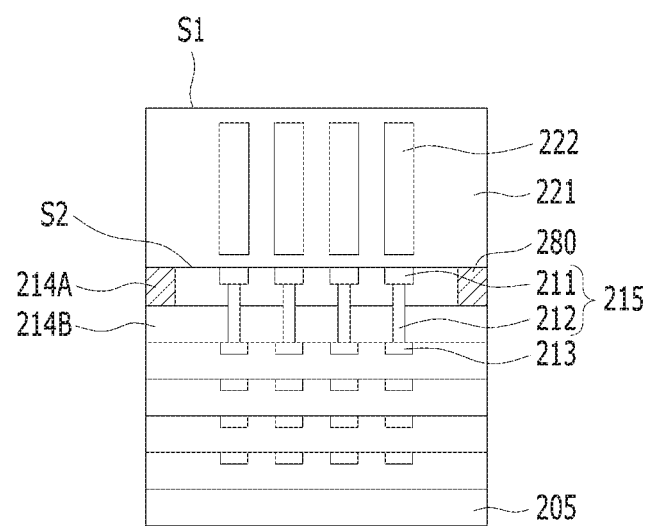

As shown in FIG. 5G, the wafer 205 is bonded to the signal transmission unit 210 and a grinding process is performed to the first surface of the substrate 221. Thus, the thickness of the substrate 221 may be reduced.

Figure 5H:
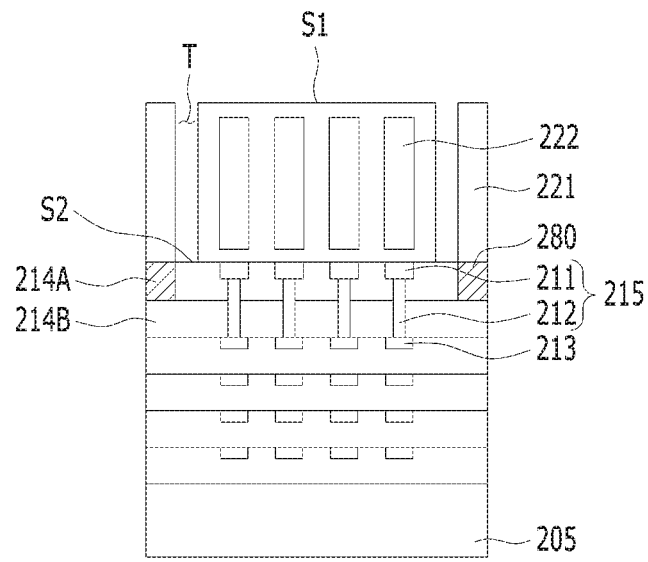

As shown in FIG. 5H, the substrate 221 is selectively etched to form a trench T until an upper surface of the sacrificial layer 270 is exposed. The trench T penetrates the substrate 221 and may be formed in a ring shape that surrounds the photoelectric transformation element 222. The forming process of the trench T includes forming hard mask (not shown) on the substrate 221 and etching the substrate 221 until the surface of the sacrificial layer 270 is exposed using the hard mask as an etching barrier. The substrate 221 may be etched by a dry etching.

Figure 5I:
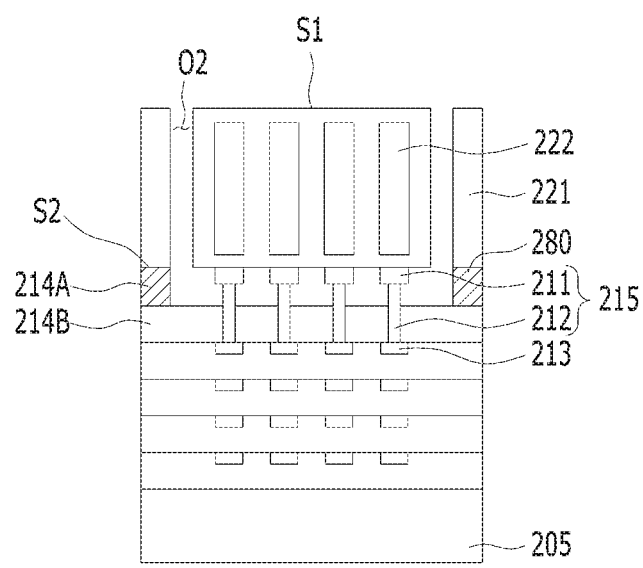

As shown in FIG. 5I, the sacrificial layer 270 (See also FIG. 5C) is etched by injecting an etching solution into the surface of the sacrificial layer 270 exposed by the trench T so that a second opening O2 exposing the surface of the second insulation layer 214B is formed.

The second opening O2 may include the first opening O1 and the trench T. During the second opening O2 forming process, the supporting unit 215 including the gate 211 and the plug 212 can prevent the substrate structure 220 from collapsing when the sacrificial layer 270 is removed.

Figure 5J:
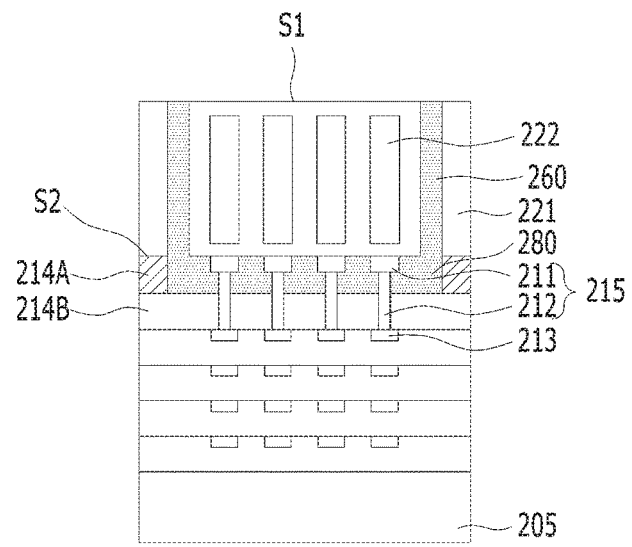
Figure 5K:
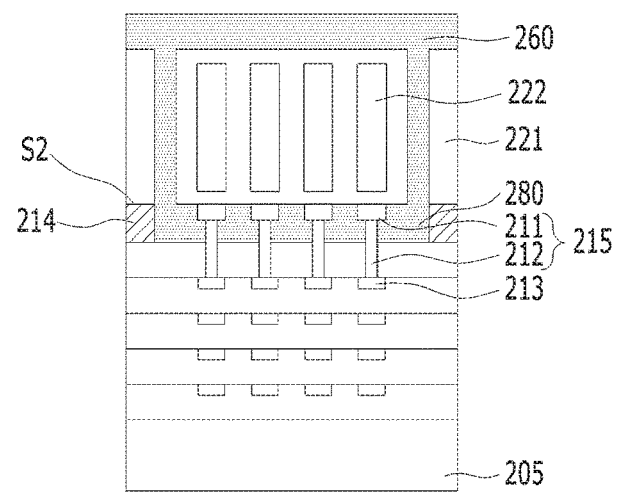

As shown in FIGS. 5J and 5K, a shielding layer material 260 is buried in the second opening O2 and is deposited until the shielding layer material 260 covers the top surface of the substrate 221. The shielding layer material 260 may be formed of a material having a high gap-fill property to fill the trench T. Also, the shielding layer material 260 may be an insulation material having light shielding properties.

Figure 5L:
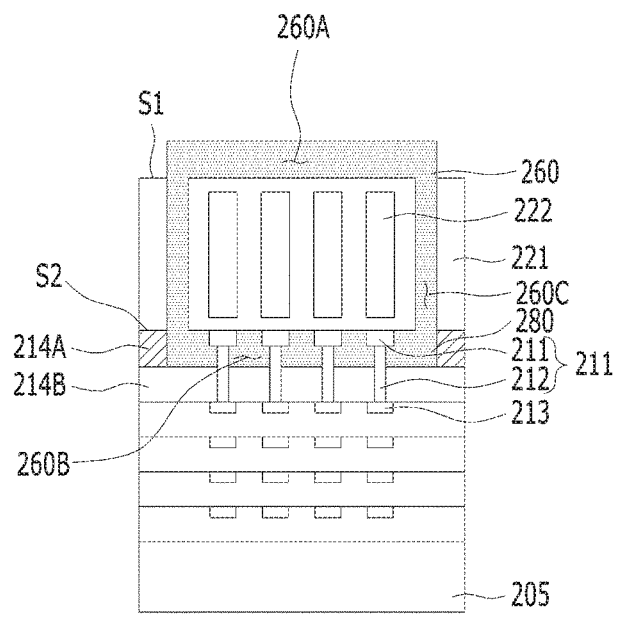

As shown in FIG. 5L, the first, second and third shielding layers 260A, 260B and 260C are formed by selectively etching the shielding layer material 260 formed over the first surface S1 of the substrate.

The first shielding layer 260A to the third shielding layer 260C are formed to surround the entire photoelectric transformation element 222 of the optical black pixel array region 100C.

The first shielding layer 260A and the second shielding layer 260B which overlap the photoelectric transformation element 222, are formed over the first surface S1 and the second surface S2 respectively, and may be of a planar shape. The third shielding layer 260C penetrates the substrate 221 and may be of a ring shape that contacts the first shielding layer 260A and the second shielding layer 260B and surrounds the photoelectric transformation element 222.

Thereafter, the image sensor may be formed using a well-known fabricating method.

As described above, the method of fabricating the image sensor according to the embodiment of the present invention may shield the incident light and the electrical crosstalk from the outside, thereby generating an optical black signal having a dark level without noise.

Furthermore, since the first shielding layer 260A to the third shielding layer 260C are formed after the source and drain regions and the metal wire 213 accompanying a heat treatment are formed, a deterioration of properties of the first shielding layer 260A to the third shielding layer 260C caused by the heat treatment may be prevented.

Hereinafter, an example of a method of fabricating an optical black pixel array region of an image sensor according to the embodiment shown in FIG. 3 will be described in detail with reference to FIGS. 6A to 6C.

Figure 6A:
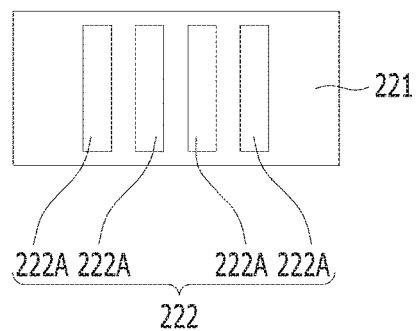
FIGS. 6A to 6C are cross-sectional views illustrating a method of fabricating an image sensor shown in the FIG. 3.
Figure 6B:
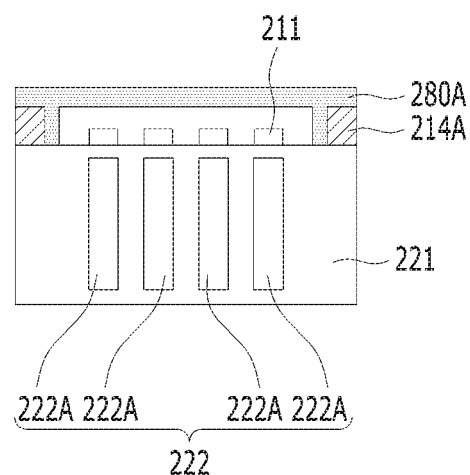
Figure 6C:
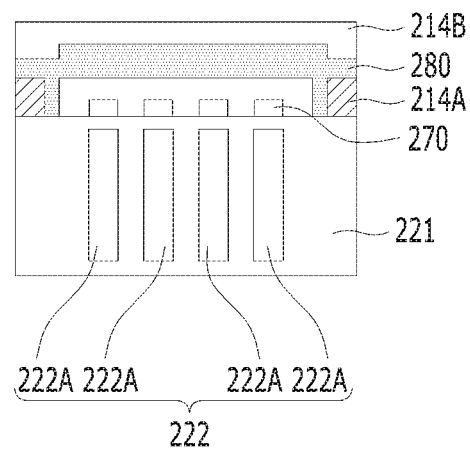

FIGS. 6A to 6C show only the optical black pixel array region and a detailed description of portions overlapping with FIGS. 4A to 4L is omitted for convenience of description.

As shown in FIG. 6A, the photoelectric transformation element 222 is formed over the substrate 221. The photoelectric transformation element 222 may comprise a plurality of photoelectric transformation regions 222A. The substrate 221 on which the photoelectric transformation element 222 is formed may correspond to the substrate structure 220 shown in FIG. 3, and the substrate 221 may have the first surface S1 and the second surface S2 facing the first surface S1. If the first surface S1 is the top surface, then the second surface S2 may be the bottom surface.

As shown in FIG. 6B, gates 211 are formed over the second surface S2 of the substrate 221. The gates 211 may include, for example, the gate of the transfer transistor TX and the gates of other pixel transistors such as a selection transistor, a reset transistor, and an access transistor may be formed while the gate of the transfer transistor TX is formed.

Next, a first insulation layer pattern 214A is formed over the second surface S2 of the substrate 221. The first insulation layer pattern 214A may include a first opening O1 corresponding to a region in which a shielding layer 260 is to be formed. The first insulation layer pattern 214A may be thicker than each of the gates 211 so that a sacrificial layer 270 covers the gates 211 completely. The first insulation layer pattern includes an insulation layer including a first opening O1. The first opening O1 is formed by etching the insulation layer until the substrate 221 overlapping the photoelectric transformation element 222 is exposed.

Next, the sacrificial layer 270 is gap-filled to the first opening O1 so as to cover the gate 211 completely. The first insulation layer pattern 214A may be used as a mold layer or a guide pattern to form the sacrificial layer 270. The sacrificial layer 270 may have an etch selectivity to adjacent structures and may be formed of a material that is easily wet etched. The adjacent structure may include the substrate 221 and the first insulation layer pattern 214A.

Then the sacrificial layer 270 is selectively etched to have an area smaller than the first opening O1. That is, the sacrificial layer 270 is selectively etched to form a gap between the sidewalls of the sacrificial layer 270 and the first insulation layer pattern 214A. A passivation layer 280 is then formed to fill the gap and cover the sacrificial layer 270.

As shown in FIG. 6C, the second insulation layer 214B is formed over a structure including the passivation layer 280.

Thereafter, the image sensor may be formed using the fabricating method described in 5D to 5L.

As described above, in the method of fabricating the image sensor according to the second embodiment, a passivation layer is formed, thereby preventing damage to the formed structure during the process of removing the subsequent sacrificial layer 270.

The image sensor in accordance with the embodiment of the present invention may be applied to diverse electronic devices or systems.

Hereafter, an example in which the image sensor in accordance with the embodiment of the present invention is applied to a camera is described by referring to FIG. 7.

FIG. 7 illustrates an electronic device including the image sensor in accordance with the embodiment of the present invention.

Referring to FIG. 7, the electronic device to which the image sensor in accordance with the embodiment of the present invention is applied may be a camera capable of capturing still images or moving pictures.

The electronic device may include an image sensor 600, an optical system or an optical lens 610, a shutter unit 611, a driving unit 613 for controlling/driving the image sensor 600 and the shutter unit 611, and a signal processing unit 612.

The optical system 610 may guide an image light i.e., the incident light from a subject to a pixel array refer to the pixel array 2 of FIG. 1 of the image sensor 300.

The optical system 610 may include a plurality of optical lenses.

The shutter unit 611 may control a light radiation time and a light shutting time for the image sensor 600.

The driving unit 613 may control a transmission operation of the image sensor 600 and a shutting operation of the shutter unit 611.

The signal processing unit 612 may process diverse kinds of signals for the signals outputted from the image sensor 600. Image signals Dout after the signal processing may be stored in a storage medium, such as a memory, or outputted onto a monitor.

According to the embodiments of the present invention, the first shielding layer to the third shielding layer, which completely surrounds the photoelectric transformation element of the optical black pixel array so that an optical shielding properties and electrical insulation properties for black pixel arrays. Thus, it is possible to generate an optical black signal having a dark level without noise.

Since the first shielding layer 260A to the third shielding layer 260C are formed after source and drain regions and the metal wire 213 accompanying a heat treatment are formed, a deterioration of properties of the first shielding layer 260A to the third shielding layer 260C caused by the heat treatment may be prevented.

While the present invention has been described with respect to specific embodiments, it will be apparent to those skilled in the art that various changes and modifications may be made without departing from the spirit and scope of the invention as defined in the following claims.

What is claimed is:

1. An optical black pixel array of an image sensor, comprising:
a substrate including a photoelectric transformation element, the substrate including a first surface and a second surface faced to the first surface;
first and second shielding layers overlapped to photoelectric transformation element and formed over the first and second surfaces, respectively; and
a third shielding layer surrounding the photoelectric transformation element and contacted to the first and second shielding layers by penetrating the substrate,
wherein each of the first to third shielding layers includes a light shielding property.

2. The optical black pixel array of the image sensor of claim 1, wherein the first and second shielding layers are of a planar shape.

3. The optical black pixel array of the image sensor of claim 1, wherein the third shielding layer is of a ring shape.

4. The optical black pixel array of the image sensor of claim 1, wherein each of the first to third shielding layers are formed of an insulation material including the light shielding property.

5. The optical black pixel array of the image sensor of claim 1, wherein the photoelectric transformation element includes a plurality of photoelectric transformation regions.

6. An optical black pixel array of an image sensor, comprising:
a substrate including a photoelectric transformation element, the substrate including a first surface and a second surface faced to the first surface;
first and second shielding layers overlapped to the photoelectric transformation element and formed over the first and second surfaces of the substrate, respectively;
a third shielding layer surrounding the photoelectric transformation element and contacted to the first and second shielding layers by penetrating the substrate;
a signal transmission unit including a multi-layered metal wires formed over the second shielding layer; and
a supporting unit electrically connecting the photoelectric transformation element and the signal transmission unit and interposed therebetween.

7. The optical black pixel array of the image sensor of claim 6, further comprising:
a first insulation layer formed between the lowermost metal wire among the multi-layered metal wires and the second shielding layer; and
a second insulation layer formed between the first shielding layer and the second shielding layer.

8. The optical black pixel array of the image sensor of claim 7, wherein the second insulation layer is formed to surround an outer wall of the second shielding layer.

9. The optical black pixel array of the image sensor of claim 6, wherein the supporting unit is formed to penetrate the second shielding layer.

10. The optical black pixel array of the image sensor of claim 6, wherein the supporting unit includes:
a transistor electrically connected to the photoelectric transformation element; and
a plug electrically connected to the transistor and the lowermost metal wire among the multi-layered metal wires.

11. The optical black pixel array of the image sensor of claim 6, wherein the first and second shielding layers are of a planar shape and the third shielding layer are of a ring shape.

12. The optical black pixel array of the image sensor of claim 6, wherein each of the first to third shielding layers is formed of an insulation material including a light shielding property.

13. The optical black pixel array of the image sensor of claim 6, wherein the photoelectric transformation element includes a plurality of photoelectric transformation regions.

14. The optical black pixel array of the image sensor of claim 6, further comprising:
   a color filter layer formed over the first shielding layer; and
   a plurality of micro-lenses formed over the color filter.

15. A fabricating method of an optical black pixel array of an image sensor, comprising:
   forming a photoelectric transformation element in a substrate including a first surface and a second surface faced to the first surface; and
   forming a shielding layer surrounding and overlapping the photoelectric transformation element,
   wherein the shielding layer includes:
   first and second shielding layers formed over the first and second surfaces, respectively; and
   a third shielding layer surrounding the photoelectric transformation element and contacting to the first and second shielding layers by penetrating the substrate,
   wherein each of the first to third shielding layers includes a light shielding property.

16. The method of the claim 15, before the forming of the shielding layer, further comprising:
   forming a supporting unit over the second surface of the substrate; and
   forming a signal transmission unit including a multi-layered metal wires.

17. The method of the claim 16, wherein the supporting unit further includes:
   a transistor electrically connected to the photoelectric transformation element; and
   a plug electrically connected to the transistor and the lowermost metal wire among the multi-layered metal wires.

18. The method of the claim 16, wherein the forming of the supporting unit, further includes:
   forming the supporting unit over the second surface of the substrate;
   forming a transistor electrically connected to the photoelectric transformation element over the second surface of the substrate;
   forming a first insulation layer over the second surface of the substrate to cover a gate of the transistor;
   forming a first insulation pattern overlapping the photoelectric transformation element and including a first opening formed by etching the first insulation layer;
   forming a sacrificial layer in the first opening;
   forming a second insulation layer over the first insulation pattern including the sacrificial layer; and
   forming a plug electrically connected to the transistor by penetrating the second insulation layer and the sacrificial layer.

19. The method of the claim 18, wherein the forming of the shielding layer surrounding the photoelectric transformation element, includes:
   forming a trench by etching the substrate starting from the first surface of the substrate to expose the sacrificial layer;
   forming a second opening by removing the sacrificial layer; and
   depositing a shielding material to the second opening until the shielding material covers the first surface of the substrate.

20. The method of the claim 18, further comprising:
   forming a passivation layer between the second insulation layer and the sacrificial layer.

\* \* \* \* \*